United States Patent
Chen et al.

(10) Patent No.: US 6,706,974 B2
(45) Date of Patent: Mar. 16, 2004

(54) PLANE SPLITS FILLED WITH LOSSY MATERIALS

(75) Inventors: Juan Chen, Hillsboro, OR (US); Adam J. Norman, Forest Grove, OR (US); Ponniah Ilavarasan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 107 days.

(21) Appl. No.: 10/053,810

(22) Filed: Jan. 18, 2002

(65) Prior Publication Data

US 2003/0136580 A1 Jul. 24, 2003

(51) Int. Cl.[7] .......................... H05K 1/11; H01R 12/04
(52) U.S. Cl. ..................... 174/261; 174/255; 174/256; 361/792; 361/780
(58) Field of Search ................... 174/261, 250, 174/255, 256, 257, 260; 361/792, 795, 760, 738, 780, 794, 793, 777

(56) References Cited

U.S. PATENT DOCUMENTS

| | | | | |
|---|---|---|---|---|
| 5,131,140 A | * | 7/1992 | Zimmer | 29/846 |
| 5,428,506 A | * | 6/1995 | Brown et al. | 361/794 |
| 5,497,037 A | * | 3/1996 | Lee et al. | 307/42 |
| 5,587,887 A | * | 12/1996 | Price et al. | 361/794 |
| 5,764,491 A | * | 6/1998 | Tran | 361/794 |
| 6,058,022 A | * | 5/2000 | Gianni et al. | 361/794 |
| 6,349,038 B1 | * | 2/2002 | Hailey | 361/794 |

OTHER PUBLICATIONS

"Welcome to Ohmega Technologies, Inc.," Ohmega Technologies, Inc. press release. http://www.ohmega.com/.

* cited by examiner

Primary Examiner—Evan Pert
Assistant Examiner—I B Patel
(74) Attorney, Agent, or Firm—Blakely, Sokoloff, Taylor & Zafman LLP

(57) ABSTRACT

A method of reducing electromagnetic interference and improving signal quality in printed circuit boards with plane splits is described. The use of a lossy slot filling is described. The lossy filling is applied above plane splits and squeezed into the slots. The lossy material helps to damp antenna resonance.

13 Claims, 8 Drawing Sheets

PLANE SPLITS FILLED WITH LOSSY MATERIALS

FIELD OF THE INVENTION

The present invention pertains to the field of printed circuit boards. More particularly, the present invention relates to a method to help provide an improved high frequency current return path through the use of high frequency conductive materials in splits of PCB planes.

BACKGROUND OF THE INVENTION

A printed circuit board (PCB) typically consists of one or more layers of conductive circuitry supported and separated by a dielectric material. Thus, printed circuit boards have outer layers and inner layers. The outer layers of a PCB are usually used for component placement and test pins.

A motherboard, or back plane, is an example of a printed circuit board. Components such as modules, connectors, subassemblies, and other printed circuit boards are often mounted on a motherboard. Interconnections on the motherboard are made utilizing traces on the board. The inner layers of a PCB also have circuitry. Power is supplied to the circuitry using power and ground layers.

The flowchart of a typical PCB manufacturing process of a conducting metal layer is demonstrated in FIG. 1. Once the process is initiated by operation 100, a thin conducting metal layer is usually added to the entire wafer surface in operation 110. The next operation 120 is photolithography. The entire surface of the wafer is covered with a thin film of photoresist during photolithography. Some portions of the wafer are then exposed to ultraviolet light using a photomask which changes the solubility of the underlying photoresist, hardening the photoresist or making it resistant to certain chemicals. During development, the photoresist of the wafer regions not exposed to ultraviolet light is washed away using solvent in operation 130. The conducting metal layer below is then etched away in operation 140. Next, the hardened photoresist is stripped away in operation 150. Finally, the wafer is inspected in operation 160 before the process ends.

A PCB typically consists of layers of fiberglass sheet laminated with etched copper patterns. FIG. 2 shows an example of a four layer PCB stackup. The four layers consist of signal layers 210 and 270, power layer 230, and ground layer 250. The signal layers 210 and 270 are conductive layers. As previously stated, the power and ground layers 230 and 250 help define the voltages delivered to the components added to the PCB.

A core layer 240 is sandwiched between the power layer 230 and ground layer 250. Unlike the signal layers 210 and 270, the core layer 240 is generally an insulating layer of dielectric material with copper adhered to both sides. The copper is used to form conductive circuits. The core material can be rigid or flexible. A prepreg layer 220 exists between the signal layer 210 and the power layer 230. Similarly a prepreg layer 260 exists between the ground layer 250 and the signal layer 270. The prepreg layers 220 and 260, also known as the pre-impregnated layers, consist of the core material impregnated with a synthetic resin partially cured to an intermediate stage. The prepreg layers 220 and 260 are used to bond two materials together. Like the core layer 240, the prepreg layers 220 and 260 are insulating layers.

The power layer 230 typically contains many splits due to multiple voltage partitions on the plane. The locations of the voltage partitions are known as plane splits or crossing splits. The splits make routing difficult for high-speed signals in adjacent signal layers. The current return path of high-speed signals are typically along the closest planes.

Plane splits create adverse signal integrity (SI) and electro magnetic compatibility (EMC) problems. For example, signals are distorted and crosstalk levels may increase dramatically as a result of plane splits. In addition, emission levels, defined by electro magnetic interference (EMI), has been shown to increase by 10–30 dB. FIG. 3 depicts simulation results of signal distortions that result from plane splits. The waveform of a single bit signal is shown in waveform 310. In contrast, odd mode waveform 320 and even mode waveform 330 demonstrate multiple bit signal switching effects. The odd mode waveform 320 is created by switching the odd mode signal 180 degrees out of phase with respect to the other bits in the signal bus. In contrast, the even mode waveform 330 is created by switching the even mode signal in phase with respect to the other bits in the signal bus.

FIG. 4 depicts a plane split 410 that divides the power layer into two sections: 232 and 234. In order to minimize degradation in performance as a result of the plane split 410, board designers typically add a stitching capacitor 420 across the plane split 410 or redirect offending traces to another layer, such as ground layer 250, with decoupling capacitors 430 and 440. This, however, adds to the routing complexity and to the cost of the board. The number of layers in the board can also be increased to help alleviate the problems associated with plane splits. Similar to adding capacitors, adding board layers will increase the manufacturing cost of the PCB.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A high frequency conductive or lossy material can be added to plane splits to help provide an improved high frequency current return path and to reduce radiation from the splits. Lossy material is defined by a material having high DC impedance and moderate conductivity. This material is usually composed of a metal conductor embedded in an insulator. One example of a lossy material that can be added to plane splits is conductive ink. In conductive ink, silver particles are embedded in an insulator. A similar material to conductive ink is resistive ink. Thus, resistive ink is often substituted in place of conductive ink in certain applications.

Yet another example of a lossy material that can be applied to splits is conductive tape. A conductive tape is composed of metal fibers surrounded by a glue layer.

Figure 5:
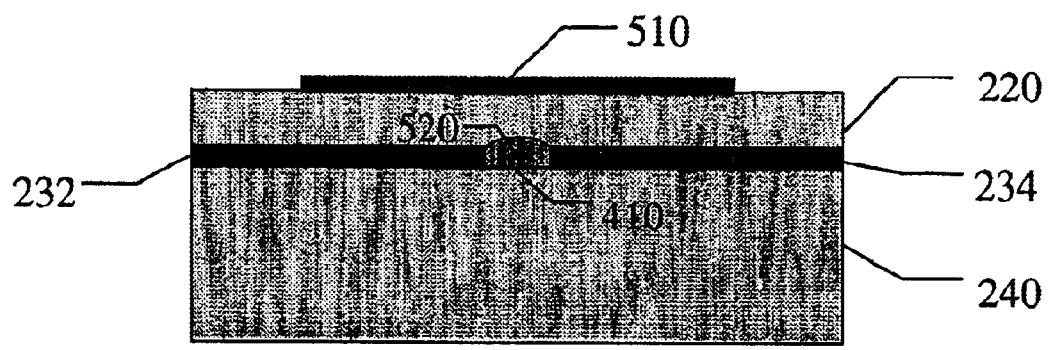
FIG. 5 shows a board stackup with lossy filling.

FIG. 5 depicts a PCB with lossy filling. In one embodiment of the invention, the power plane is divided into two separate sections 232 and 234 by a plane split 410. The power plane sections 232 and 234 are sandwiched between a prepreg layer 220 and a core layer 240. A high-speed trace 510 rests above the prepreg layer 220. A lossy filling 520 is inserted in the plane split 410 between power plane sections 232 and 234 in order to provide a high frequency current return path.

As previously stated, the lossy material has a high DC impedance and moderate conductivity. High DC impedance ensures that the material does not accidentally short power plane sections 232 and 234 together. Because sections 232 and 234 may have different DC voltage levels and are required to be isolated from one another, shorting the two power plane sections together is extremely undesirable. Furthermore, moderate conductivity is required in order to provide a low impedance return path for high-speed signals.

For one embodiment, the DC impedance has a range of approximately 1 k ohm to 10 k ohm, while the conductivity has a range of approximately 100 Mho/m to 1,000 Mho/m. In contrast, the conductivity of a traditional copper trace is approximately 58 Mho/m. The lossy material attributes should be consistent at high frequencies.

Figure 3:
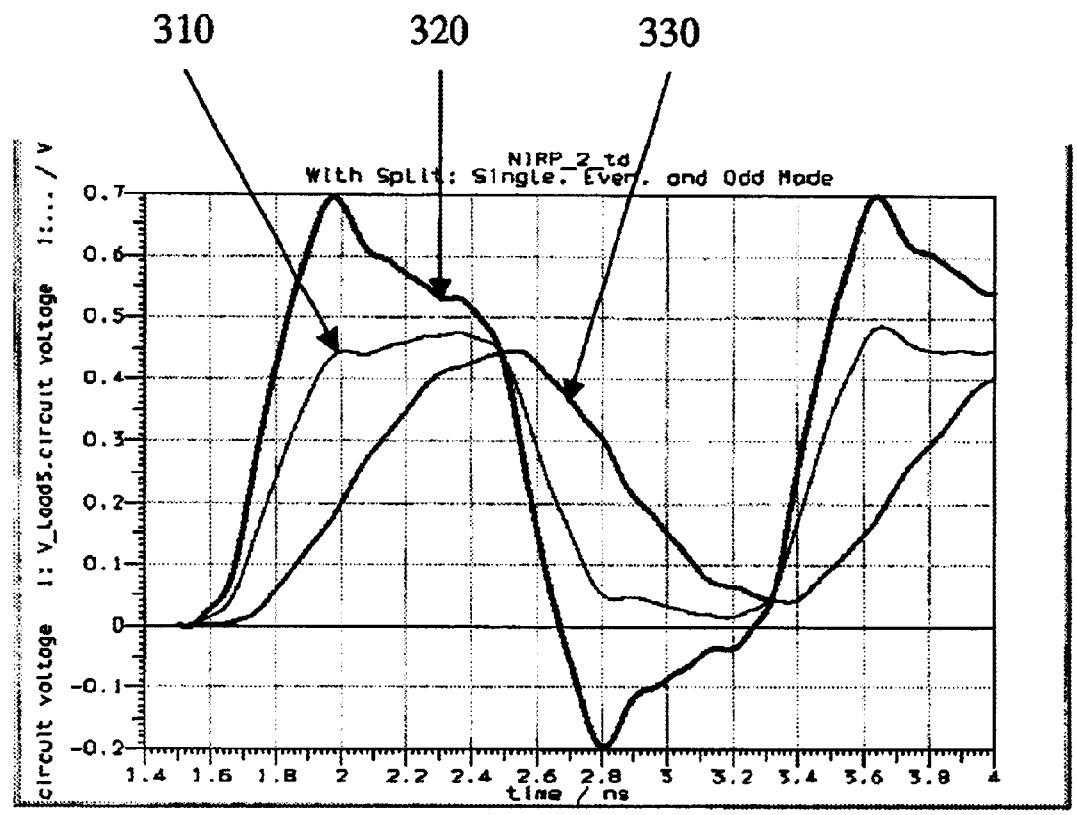
FIG. 3 shows simulation results of signals across plane splits.
Figure 6:
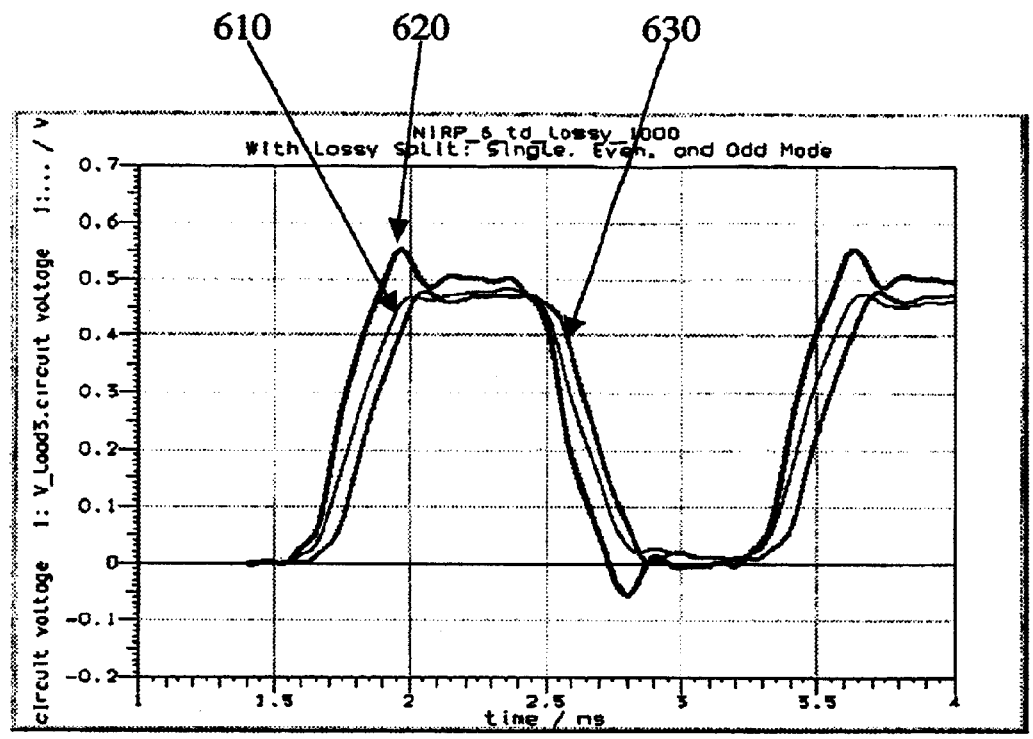
FIG. 6 shows simulation results after adding lossy filling to plane splits.

FIG. 6 depicts the simulation results of traces that have lossy fillings in the plane splits. As in FIG. 3, simulation waveforms were obtained for a single bit signal and multiple bit signals. In FIG. 6, waveform 610 is a single bit signal obtained at an input receiver. Waveforms 620 and 630 are multiple bit signals with waveform 620 being an odd mode signal and waveform 630 being an even mode signal. The signal quality of the multiple bit switching waveforms 620 and 630 are noticeably improved over the multiple bit switching signals of waveforms 320 and 330. The improvements are due to the lossy filling providing a better high frequency current return path than the use of decoupling capacitors.

Figure 1:
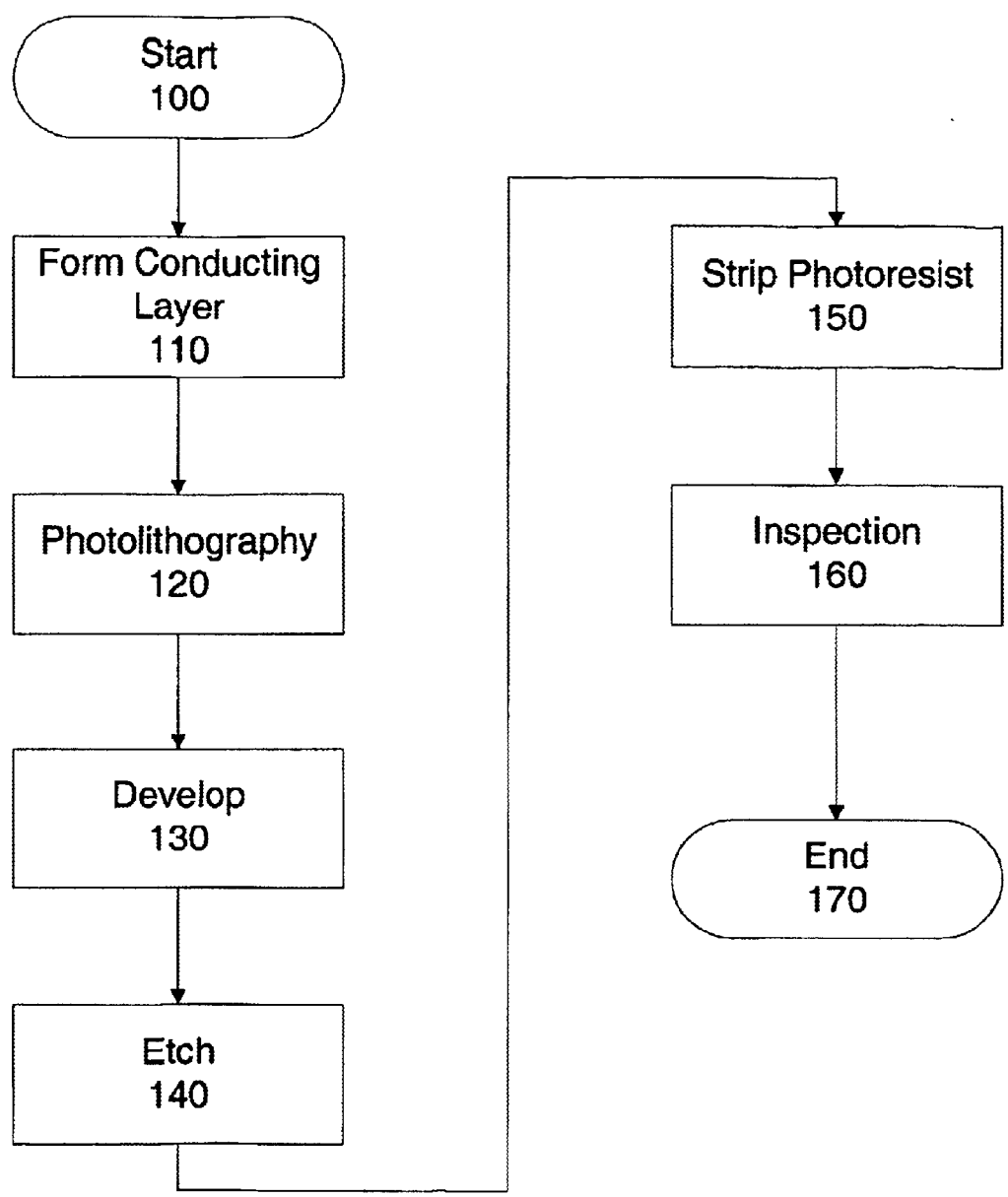
FIG. 1 shows a flowchart of a typical PCB manufacturing process of a conducting layer.
Figure 2:
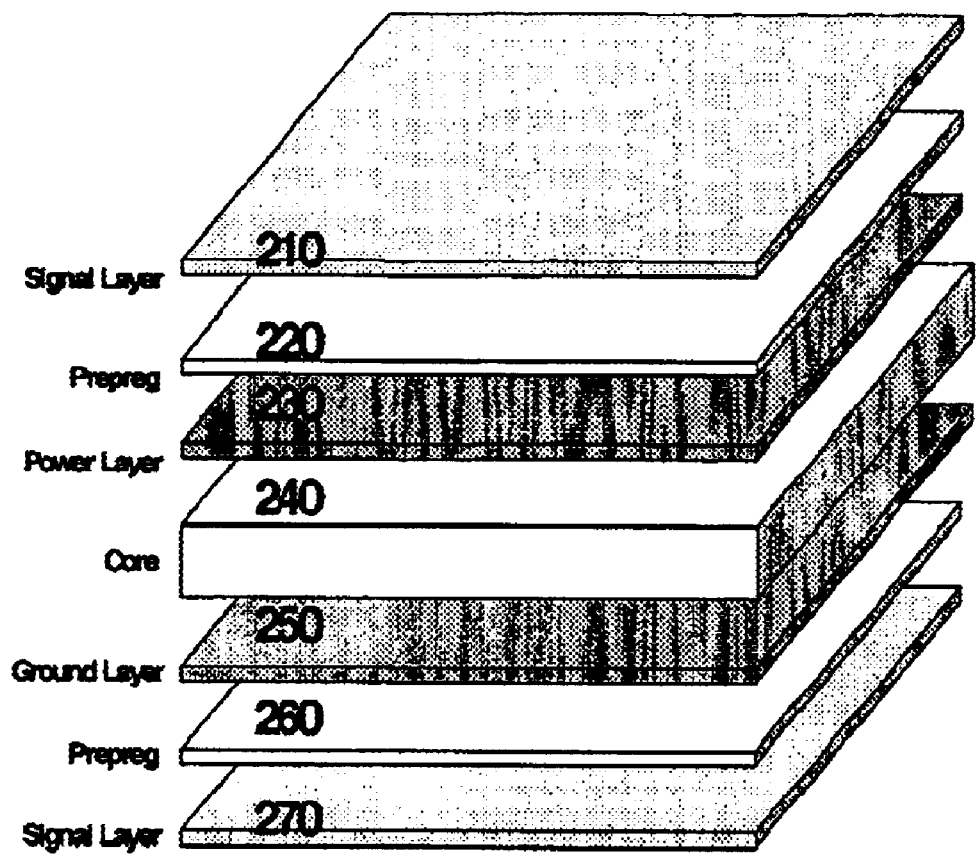
FIG. 2 shows a four layer PCB stackup.

The high frequency current return path of a signal is typically the next closest conducting plane. For example, a signal layer 210 as shown in FIG. 2 will generally use power layer 230 as its high frequency current return path. Thus, a plane split will result in a degraded signal quality as a result of an interruption to the current return path. A moderately conductive lossy filling material added to the plane split as in FIG. 6 allows the high frequency current to pass through the plane split. Because the high frequency current can pass through the plane split, an interruption to the current return path is avoided.

Figure 4:
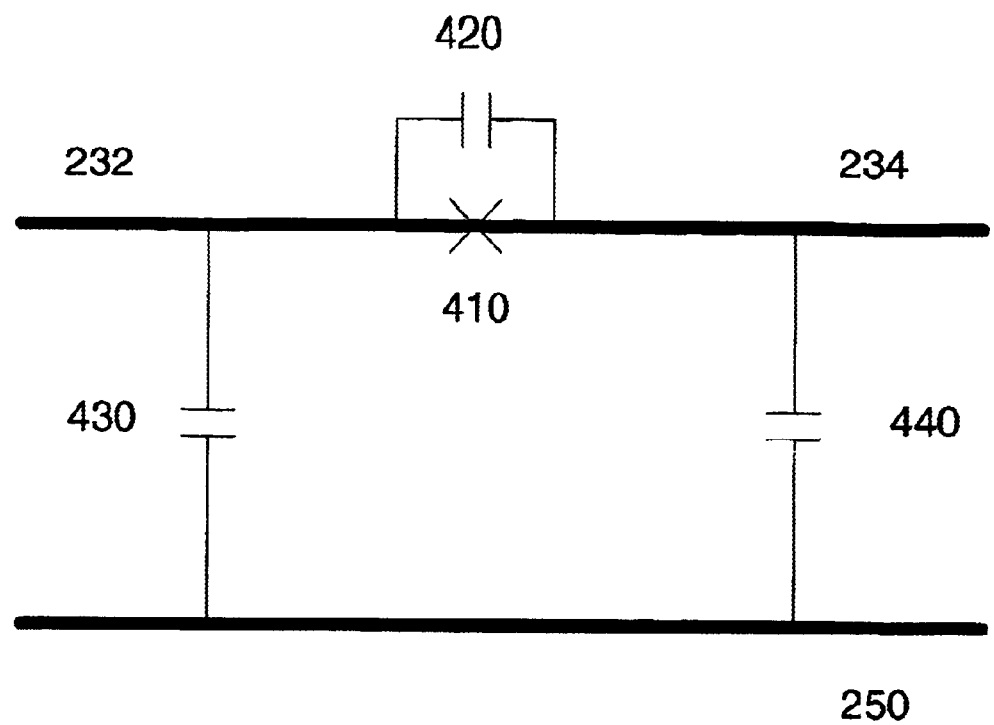
FIG. 4 shows a PCB with the use of discrete capacitors.

Otherwise, in instances where decoupling capacitors are used as shown in FIG. 4, the high frequency current return path would have to start in power plane section 232, traverse the ground plane 250 through decoupling capacitor 430 across the plane split 410 and complete in power plane section 234 through decoupling capacitor 440. Having to traverse the ground plane 250 dramatically increases the common loop area compared with the return path of a power plane with lossy filling.

As with the return path of a plane with lossy filling, the return path of a signal with a stitching capacitor 420 across the plane split 410 in the power plane has a smaller common loop area than the decoupling capacitor alternative mentioned above. Plane splits, however, are often last minute modifications as when an additional voltage level is required on an integrated circuit. As a result, plane splits are often not finalized until two or three days prior to tape-out. This places an enormous overhead in adding stitching capacitors to the power plane. In addition, room for the stitching capacitor must be available in the PCB. The lossy filling avoids problems associated with using stitching capacitors.

Besides providing a better high frequency current return path, the lossy filling also decreases radiation from plane splits. As previously discussed, plane splits greatly increase EMI emissions. The radiation mechanism for this phenomenon is partially related to the direct radiation from each excited split, which acts similar to a dipole antenna. The lossy filling provides substantial EMC benefits by reducing the emission levels.

Figure 7:
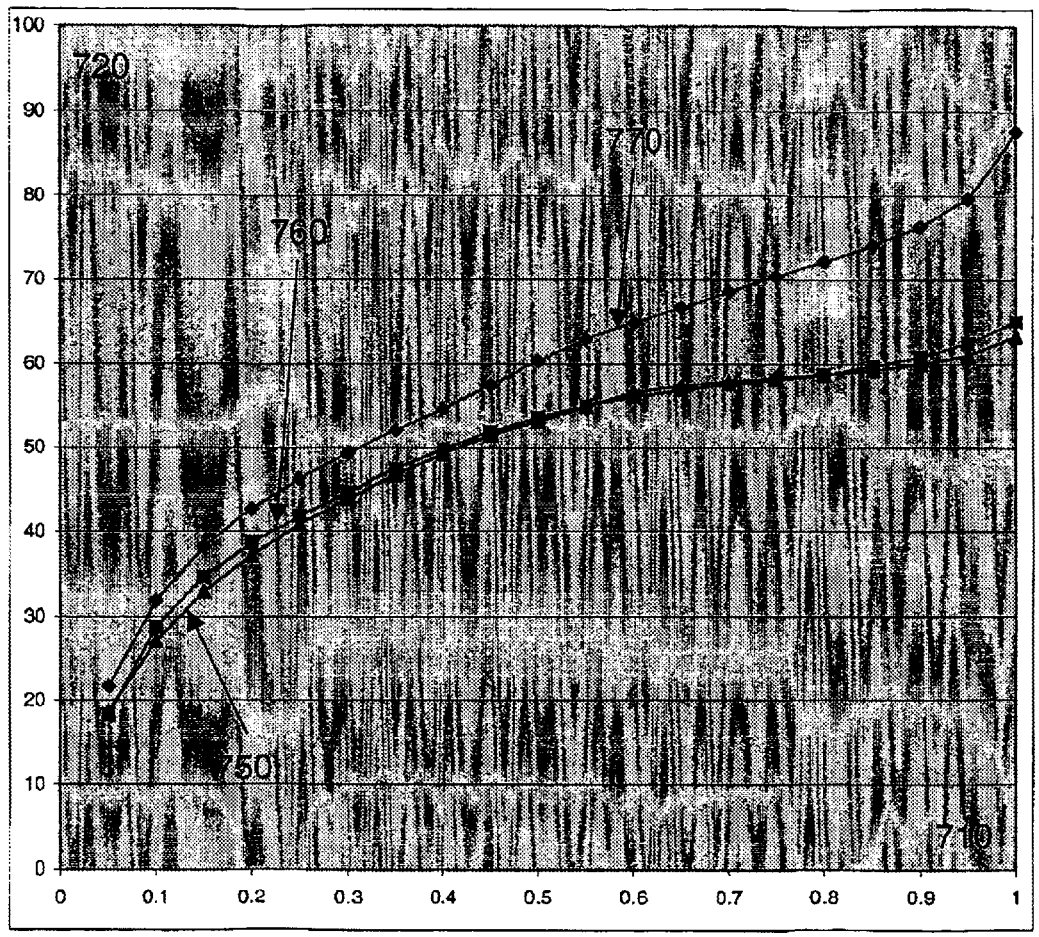
FIG. 7 shows simulated emission results of a PCB with lossy filled splits.

The simulation results depicting the benefits of a lossy filled plane split are depicted in FIG. 7. The conductivity of the material in the simulation was 100 Mho/m. The results of other conductivity materials across the preferred range of 100 Mho/m to 1000 Mho/m were comparable. X-axis 710 represents the frequency of the signals simulated. The frequency of the signals are measured in Gigahertz (GHz) or $10^{-9}$ per second. Thus, the simulation was performed between approximately 100 MHz and 1 GHz.

The Y-axis represents the radiation levels of the signals. The radiation in the simulation was measured by detecting the electric field at the location of the split from a three (3) meters distance. The radiation levels are measured in decibels (dB) of microvolts (uV) per meter. Waveform 750 is a signal that does not cross a split. Waveform 770 is a signal that crosses a split. In contrast, waveform 760 is a signal that crosses a split, but lossy filling has been added to the plane split. The simulation result demonstrates substantial EMC benefits by reducing the emission level. With a conductivity of 100 Mho/m, the far field emission was reduced by five (5) to 25 dB and is close to the level of emissions of the signal without the split.

Even though simulations were performed from 100 MHz to 1 GHz, the lossy filling will provide reduced emissions outside of this range. The current federal regulations regarding radiation emission levels are less stringent above this range. Nevertheless, the lossy material will also reduce emission levels above 1 GHz and should help circuits meet EMC requirements should the regulation standards change in the future.

Another advantage of using lossy filling rather than capacitors to minimize the effects of the plane splits is that the lossy filling reduces the cost of producing the PCB. Decoupling capacitors and stitching capacitors take up space in the PCB. This is especially true when decoupling capacitors are used since one capacitor is required on each end of the plane split. Unlike decoupling and switching capacitors, the lossy filling does not require routing space in the PCB. The lossy filling allows board designers to cross plane splits. As a result, time for routing the capacitors through the PCB is saved and valuable PCB area is conserved. Moreover, using one or two capacitors per plane split drives up the economic costs of the PCB in parts alone.

In another embodiment of the invention, there are n plane splits in the power plane, which effectively divides the power plane into n+1 sections. Similar to the example above, a lossy filling is inserted into each of the n plane splits of the power plane.

In yet another embodiment of the invention, there are plane splits in other layers of the PCB besides or in addition to the power plane. A lossy filling is inserted into each plane split of the other PCB layers. The lossy material will be effective in reducing emission levels even in planes with varying thickness. The thickness of the conductive layer may slightly change the conductivity of the metals. Simulations have shown, however, that the results are relatively stable across the conductivity range of approximately 100 Mho/m to 1,000 Mho/m.

Figure 8:
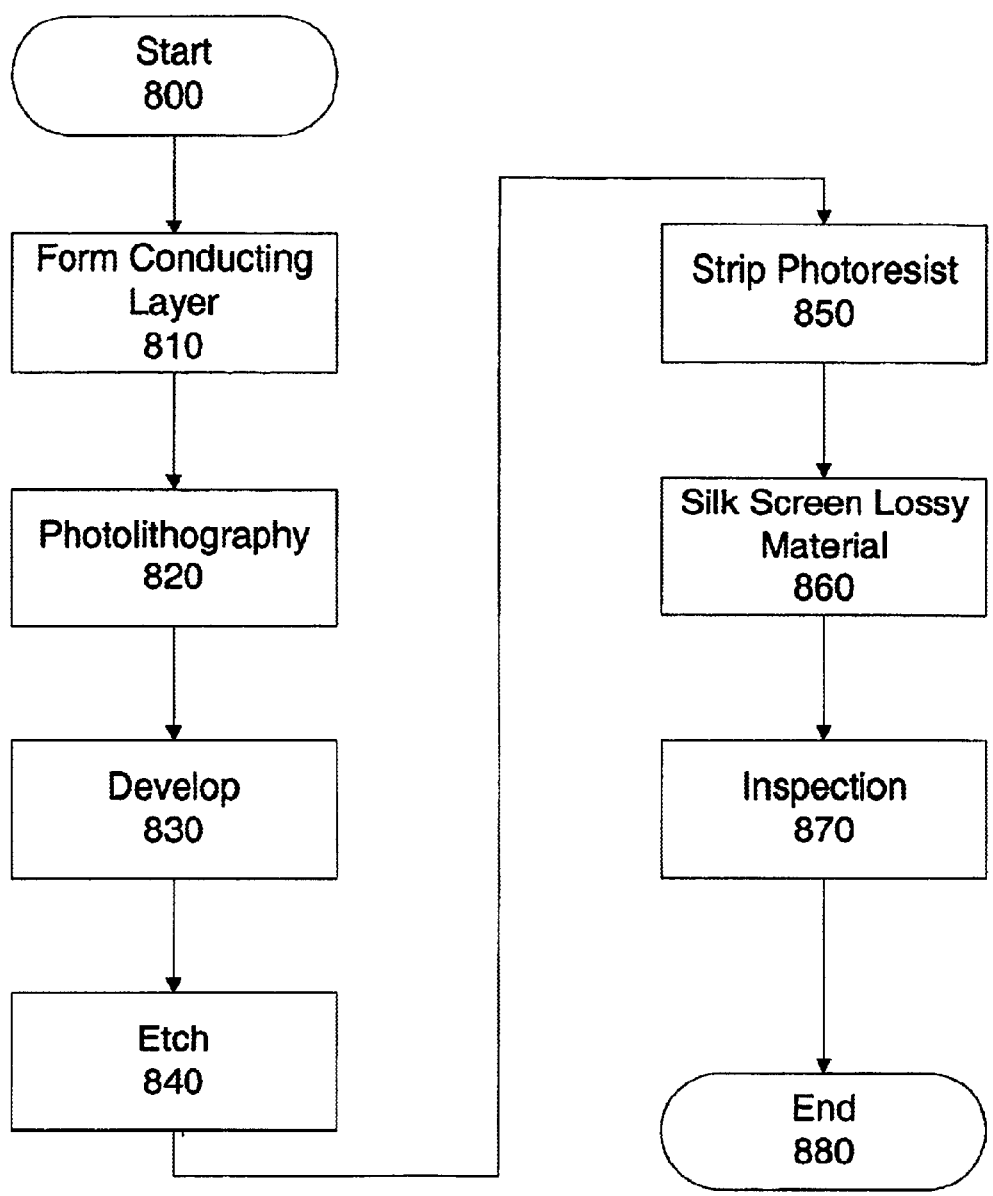
FIG. 8 shows a flowchart of a PCB manufacturing process that includes filling plane splits with lossy materials.

FIG. 8 is a flowchart of one embodiment for adding lossy filling to a PCB with splits in a PCB layer. The process is initiated in operation 800, where an oxide is grown on a silicon wafer. The silicon reacts with the oxide to form silicon dioxide. Layers are added to this silicon dioxide substrate through repeated operations involving photolithography and etching. The layers built on to the silicon wafer include signal layers, ground layers, and power layers.

In creating a PCB layer such as the power layer, a conducting metal is deposited on the surface layer of the wafer in operation 810. Metals such as aluminum and copper are often chosen as the deposited conducting metal.

In another embodiment of the invention, instead of growing oxide on a silicon wafer, copper foils are directly laminated into a layer of prepreg or core material to form the conducting metal.

Once the conducting metal has been formed, the next operation 820 involves photolithography. During photolithography, the entire surface of the wafer or laminate is covered with a thin film of photoresist. For wafer processing, the film is typically spread by placing a drop of the photoresist on the wafer and rapidly spinning the wafer.

After the film is dry, portions of the photoresist covered surface of the wafer or laminate is exposed to ultraviolet light using a photomask. The photomask exposes portions of the wafer or laminate surface, while protecting others. The portions of the resist that are not protected are washed away using a solvent in development, or operation 830. The layer of the conducting metal under the washed away photoresist is then etched and removed in operation 840. The remaining resist on the wafer or laminate surface is then stripped away in operation 850, leaving the desired regions of the wafer with an exposed layer of conducting metal.

For one embodiment of the manufacturing process, the top layer of metal exposed after operation 850 is the power layer. In this embodiment of the invention, the power layer contains numerous plane splits due to the incorporation of multiple voltage partitions in the PCB design. The plane splits are silk screened with a lossy material in operation 860. This operation involves applying a thin layer of lossy material above the plane splits and then squeezing the lossy material into the plane splits. The access lossy material can be removed before the prepreg is pressed on top of the power plane. Thus, a filling is formed between the power plane sections with a conductivity defined by the lossy material. Once the lossy material has been added, the PCB is then inspected in operation 870 before the process is terminated.

In the foregoing specification the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A printed circuit board comprising:
   a power layer, wherein the power layer has n plane splits, wherein n is an integer greater than or equal to one, wherein a lossy material fills each of the n splits; and
   a ground layer.

2. The printed circuit board of claim 1, wherein the lossy material has a DC impedance range of about 1,000 ohm to 10,000 ohm.

3. The printed circuit board of claim 1, wherein the lossy material has a conductivity range of about 100 Mho/meter to 1,000 Mho/meter.

4. The printed circuit board of claim 1, wherein the lossy material has electrical attributes that are consistent between about 100 Megahertz to 1 Gigahertz.

5. The printed circuit board of claim 1, wherein the lossy material is a conductive ink.

6. The printed circuit board of claim 5, wherein the conductive ink is comprised of a plurality of silver particles embedded in an insulating material.

7. The printed circuit board of claim 1, wherein the lossy material is a conductive tape.

8. The printed circuit board of claim 1, wherein the ground plane has a plurality of splits.

9. The printed circuit board of claim 8, wherein a lossy material is added to each of the plurality of splits in the ground plane.

10. The printed circuit board of claim 1, wherein the printed circuit board is a four layer printed circuit board.

11. An apparatus comprising:
    means for providing a high frequency return path in a first layer of a printed circuit board; and
    means for reducing radiation from plane splits in a second layer of the printed circuit board.

12. The apparatus of claim 11 further comprising a means for reducing the routing complexity in the printed circuit board.

13. The apparatus of claim 11 further comprising a means for reducing the waveform distortion of signals of the printed circuit board.

* * * * *